(12) United States Patent
Bonilla et al.

(10) Patent No.: US 8,962,467 B2
(45) Date of Patent: Feb. 24, 2015

(54) METAL FUSE STRUCTURE FOR IMPROVED PROGRAMMING CAPABILITY

(75) Inventors: Griselda Bonilla, Fishkill, NY (US); Kaushik Chanda, Santa Clara, CA (US); Samuel S. Choi, Beacon, NY (US); Ronald G. Filippi, Wappingers Falls, NY (US); Stephan Grunow, Poughkeepsie, NY (US); Naftali E. Lustig, Croton on Hudson, NY (US); Andrew H. Simon, Fishkill, NY (US); Junjing Bao, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 484 days.

(21) Appl. No.: 13/399,266

(22) Filed: Feb. 17, 2012

(65) Prior Publication Data

US 2013/0214894 A1    Aug. 22, 2013

(51) Int. Cl.
*H01L 21/44*    (2006.01)

(52) U.S. Cl.
USPC ........................................................ 438/601

(58) Field of Classification Search
CPC .............. H01L 21/768; H01L 23/5256; H01L 23/53266; H01L 23/53238; H01L 23/53223; H01H 69/02; H01H 69/022; H01H 85/046; H01H 85/0275; H01H 85/0283; H01H 85/0463; H01H 85/463; H01H 85/46
USPC ........... 438/601; 257/529, E21.577, E23.149; 337/290; 29/623
See application file for complete search history.

(56) References Cited

U.S. PATENT DOCUMENTS

| | | | |
|---|---|---|---|
| 5,903,041 A | 5/1999 | La Fleur et al. | |
| 6,242,789 B1 | 6/2001 | Weber et al. | |
| 6,252,292 B1 | 6/2001 | Brintzinger et al. | |
| 6,274,440 B1 | 8/2001 | Arndt et al. | |
| 6,633,055 B2 | 10/2003 | Bertin et al. | |
| 7,557,424 B2 | 7/2009 | Wong et al. | |
| 7,566,593 B2 | 7/2009 | Chinthakindi et al. | |
| 7,675,137 B2 | 3/2010 | Kim et al. | |
| 7,745,855 B2 | 6/2010 | Henson et al. | |
| 7,825,490 B2 | 11/2010 | Kim et al. | |
| 7,892,926 B2 | 2/2011 | Barth et al. | |
| 2004/0070078 A1 | 4/2004 | Ho et al. | |
| 2005/0285222 A1 | 12/2005 | Thei et al. | |
| 2006/0278895 A1 | 12/2006 | Burr et al. | |
| 2009/0045388 A1 | 2/2009 | Clevenger et al. | |
| 2009/0206447 A1 | 8/2009 | Basker et al. | |
| 2009/0273055 A1 | 11/2009 | Thei et al. | |
| 2009/0302416 A1 | 12/2009 | Abou-Khalil et al. | |

*Primary Examiner* — Shaun Campbell
(74) *Attorney, Agent, or Firm* — Catherine Ivers

(57) ABSTRACT

Structure providing more reliable fuse blow location, and method of making the same. A vertical metal fuse blow structure has, prior to fuse blow, an intentionally damaged portion of the fuse conductor. The damaged portion helps the fuse blow in a known location, thereby decreasing the resistance variability in post-blow circuits. At the same time, prior to fuse blow, the fuse structure is able to operate normally. The damaged portion of the fuse conductor is made by forming an opening in a cap layer above a portion of the fuse conductor, and etching the fuse conductor. Preferably, the opening is aligned such that the damaged portion is on the top corner of the fuse conductor. A cavity can be formed in the insulator adjacent to the damaged fuse conductor. The damaged fuse structure having a cavity can be easily incorporated in a process of making integrated circuits having air gaps.

9 Claims, 8 Drawing Sheets

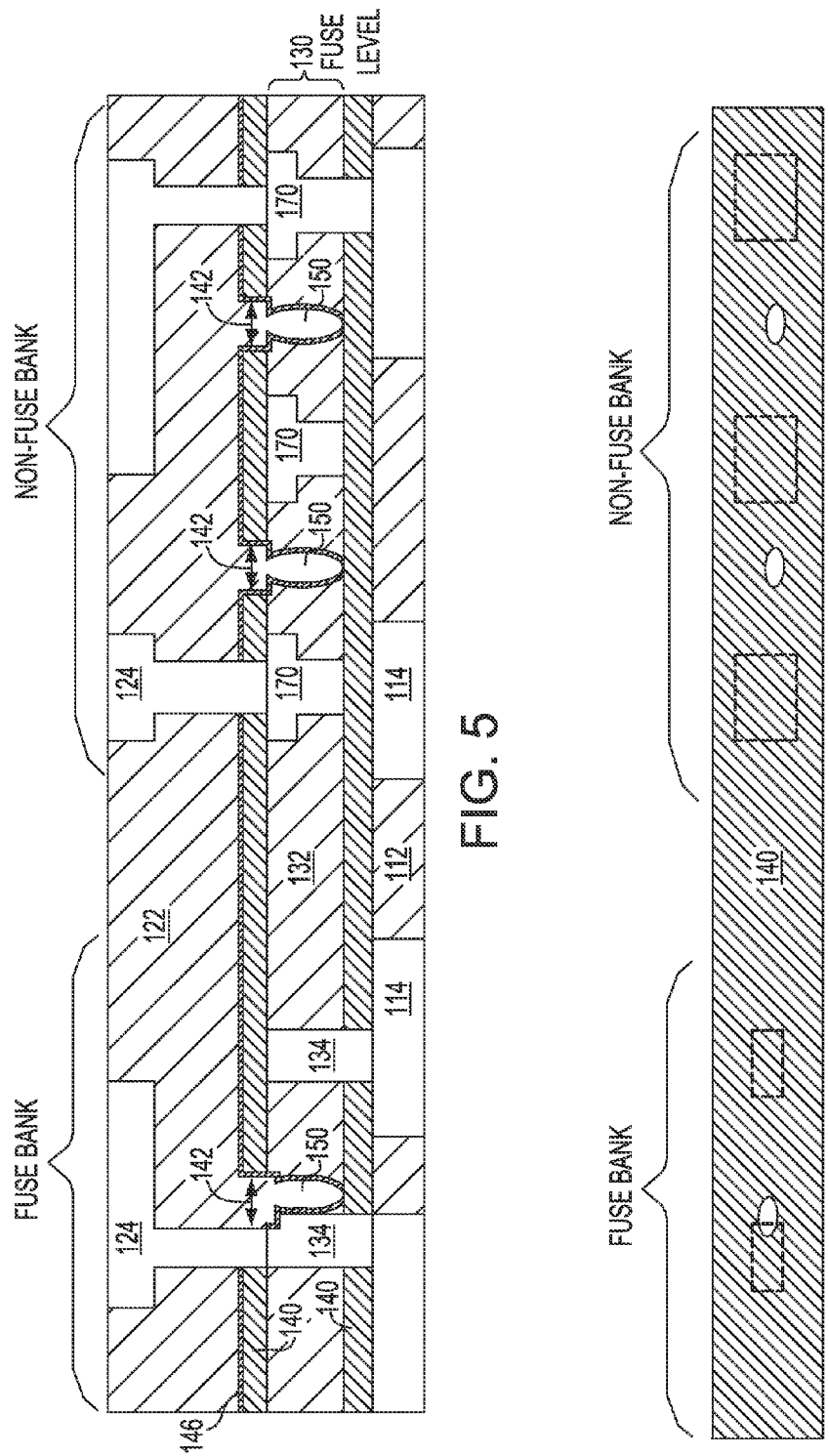

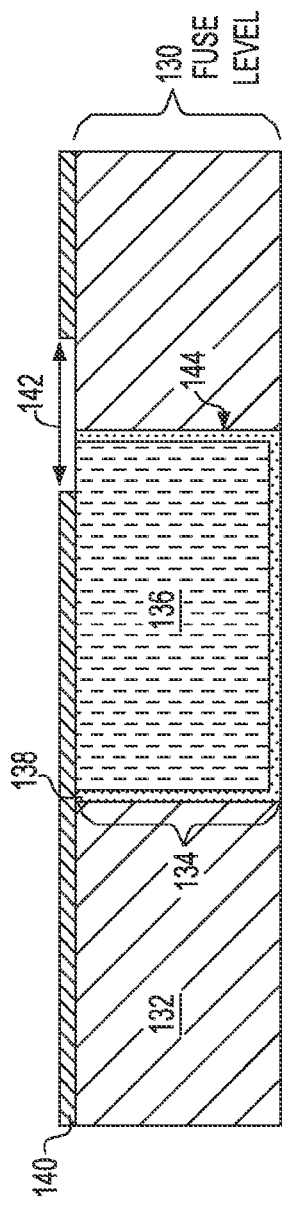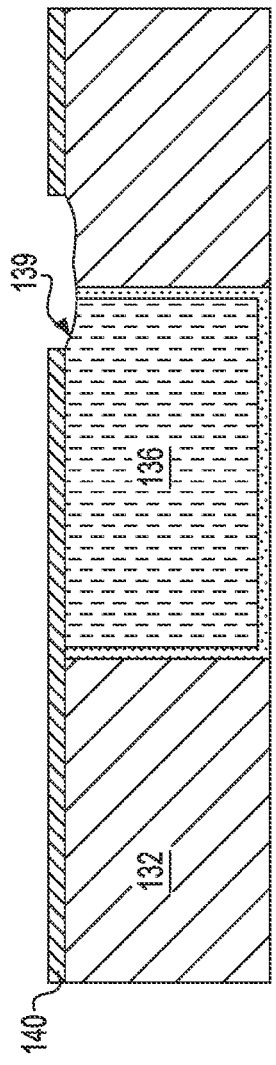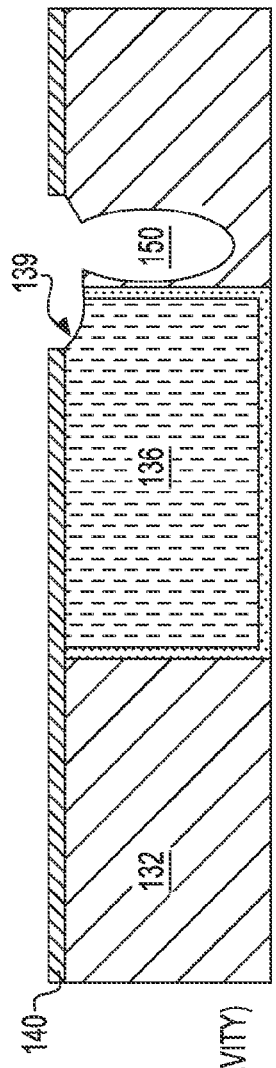

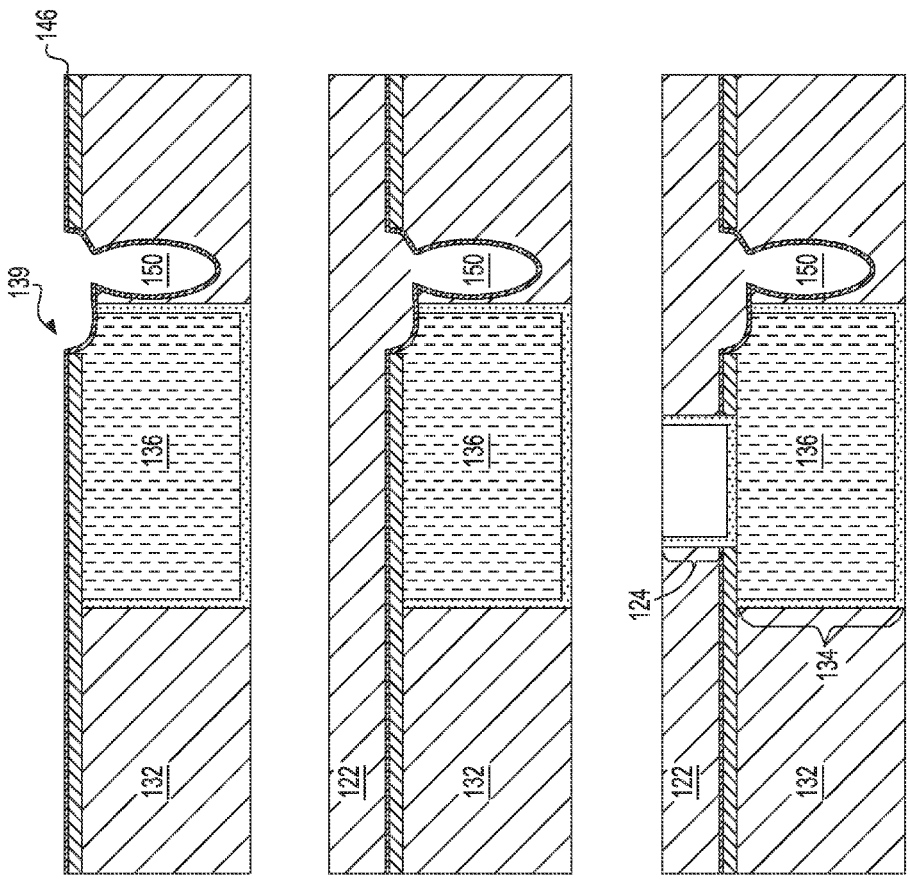

METAL FUSE STRUCTURE FOR IMPROVED PROGRAMMING CAPABILITY

BACKGROUND OF THE INVENTION

1. Field of the Invention

The present invention generally relates to electrical fuses in microelectronic devices and a method of making metal fuses. In particular, the invention relates to damaging a metal structure to control the location of fuse blow.

2. Description of Related Art

In advanced technologies, e-fuses have been implemented at the gate level where a fuse structure includes a narrow, horizontal, polycrystalline silicon (herein "poly") line topped by a silicide. During programming, a high current (i.e. high current density) is passed through the structure. High current density causes the silicide to irreversibly migrate from the top of the poly to throughout the line, causing a change in resistance and thus acting as a programmable fuse. In poly fuses, the fuse structure is often placed over oxide isolation areas. The dielectric properties of the isolation oxide keep in the heat generated by current flow, thus increasing the temperature of the structure. The increased temperature further enhances migration, thus aiding fuse blow. In addition, air cavities are sometimes formed around the poly line to further increase the heat retention because air is a better dielectric than isolation oxides.

As scaling progresses, it is becoming harder to implement fuses at the poly level due to drop in maximum allowable currents through the first metal layer or conductor. Also, the collateral damage (namely movement of fuse material causing neighboring dielectric material to fracture) associated with fuse blow is becoming more difficult to contain. Furthermore, the horizontal structure of the fuse consumes valuable chip real estate. As a result, there is a drive to implement fuses vertically at the metal interconnect levels and use the phenomenon of electromigration (EM) to program the fuses.

In a conventional metal fuse approach, as shown in FIG. 1, a two-level structure comprises conductor 11 embedded in dielectric layer 10, and via 21 and line 22 embedded in dielectric layer 20. A cap layer 23 is typically deposited over line 22 and dielectric layer 20. Electron flow is from via 21 into line 22. A high current is applied between the positive current connection (I+) and negative current connection (I−) to induce EM failure. Voltage across the structure is measured using the positive (V+) and negative (V−) voltage connections. The electron flow through the fuse structure is from the lower level metal, conductor 11, to the upper level metal, line 22. The intent is to have a failure (i.e. fuse blow) in via 21. However, with this design, some of the failures (i.e. fuse blows) occur in via 21 while other failures occur in line 22. The lack of control over the failure location results in variability in the final resistance of the fuse structure after programming.

Therefore, a structure is needed such that fuse blow occurs repeatedly and reliably at the same location. At the same time, the structure must reliably conduct current prior to fuse blow.

SUMMARY

The general principal of the present invention is to intentionally damage a portion of a fuse structure so that the fuse will blow at that damaged location. By damaging a portion of the fuse structure, the fuse will more consistently blow at a known location resulting in post-fuse-blow circuits having a more controlled and predictable final resistance.

One aspect of the invention is a fuse structure prior to fuse blow. The structure includes a first connection, a second connection and a conductor having a damaged portion.

Another aspect of the invention is a method of forming a fuse structure. The method provides a substrate having a first level which includes a first conductor and a first insulator. The method also provides a fuse level above the first level, wherein the fuse level has a fuse insulator and a fuse conductor. The method continues by forming a cap layer above the fuse insulator and the fuse conductor. The method includes forming an opening in the cap layer, and damaging a portion of the fuse conductor thereby forming a damaged portion of the fuse conductor. The method also includes forming a second level which includes a second conductor and a second insulator wherein the second insulator is aligned above at least a portion of the damaged portion of the fuse conductor.

BRIEF DESCRIPTION OF THE DRAWINGS

FIG. 5 illustrates a stacked via fuse structure prior to fuse blow in a device having cavities in fuse bank and non-fuse bank areas according to an embodiment of the present invention;

FIG. 6 is a top down view of an alignment of a cap layer opening of the device of FIG. 5 according to an embodiment of the present invention;

FIG. 8a illustrates the cap layer opening step of a method of making a fuse structure having a damaged portion according to an embodiment of the present invention.

FIG. 8b illustrates damaging a portion of the fuse conductor according to an embodiment of the present invention.

FIG. 8c illustrates forming a cavity in the fuse insulator according to an embodiment of the present invention.

FIG. 8d illustrates forming an optional thin dielectric according to an embodiment of the present invention.

FIG. 8e illustrates forming a second level insulator according to an embodiment of the present invention.

FIG. 8f illustrates forming a second level conductor according to an embodiment of the present invention.

Other objects, aspects and advantages of the invention will become obvious in combination with the description of accompanying drawings, wherein the same number represents the same or similar parts in all figures.

DETAILED DESCRIPTION OF EMBODIMENTS

Various embodiments of the fuse structure of the present invention are described in conjunction with FIGS. 2-6. Embodiments of methods of making the fuse structures of the present invention are described in conjunction with FIGS. 7-8f.

Figure 2:
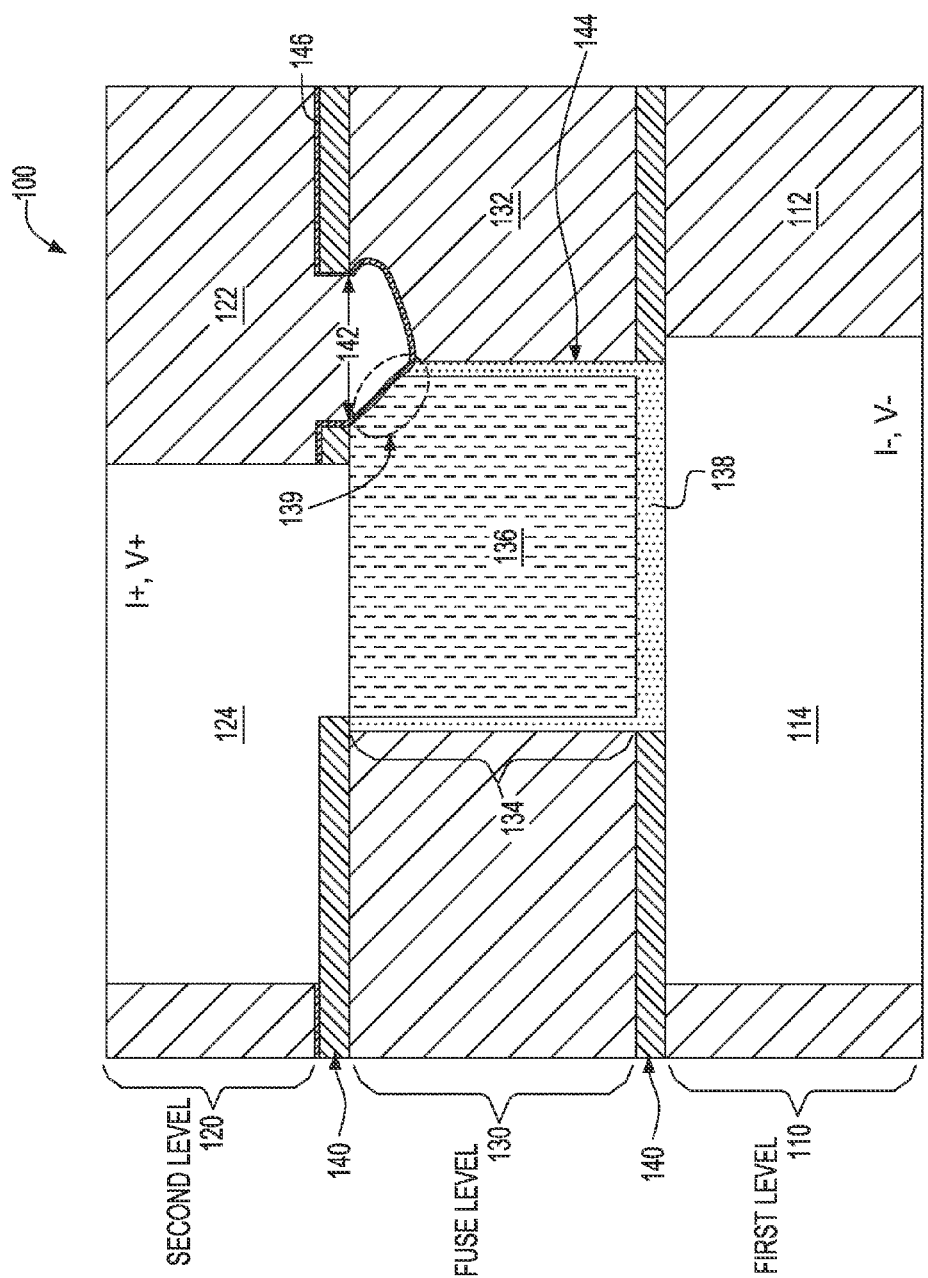
FIG. 2 illustrates a fuse structure prior to fuse blow according to an embodiment of the present invention.

Referring to FIG. 2, a fuse structure 100 prior to fuse blow is illustrated. On a substrate (not shown) is a first level 110, a second level 120 and a fuse level 130. The fuse level 130 is between the first 110 and second 120 levels. Each level includes an insulator and a conductor. The levels are separated by a cap layer 140. The first, second and fuse level insulators are denoted by reference numerals 112, 122, and 132 respectively. The first, second and fuse level conductors are denoted by reference numerals 114, 124, and 134 respectively. Each of the conductors 114, 124 and 134 can include a bulk conductor and a liner. In FIG. 2, the bulk conductor 136 and liner 138 are only shown for the fuse conductor 134 for ease if viewing. It should be understood that the first and second conductors preferably also have a bulk conductor and a liner.

Any suitable insulator material may be used for insulators 112, 122 and 132. The material used for each of the insulators 112, 122 and 132 may be the same or different. Typical insulating materials include any now known or later developed porous or non-porous insulator material such as silicon containing oxides, silicon containing oxides doped with fluorine, silicon containing nitrides, silicon containing carbides, hydrogenated silicon oxycarbides (SiCOH), silsesquioxanes, carbon-doped oxides (i.e., organosilicates) that include atoms of silicon (Si), carbon (C), oxygen (O), and/or hydrogen (H), thermosetting polyarylene ethers, SiLK™ (a polyarylene ether available from Dow Chemical Corporation), spin-on silicon-carbon contained polymer material available from JSR Corporation, and low dielectric constant materials or layers thereof. Low dielectric constant materials are those materials that have a dielectric constant less than about 3.9. The insulator levels 112, 122 and 132 may be made from a single type of insulator material, or each insulator level 112, 122, and 132 may be a series of layers of the same or different types of insulator materials. For example, but not by way of limitation, the insulator level (112, 122 and/or 132) may be $SiO_2$; or the insulator level (112, 122, and/or 132) may be a composite including a $SiO_2$ layer and a fluorine doped $SiO_2$ layer. Other combinations of layers and materials are also possible.

The material used for each capping layer 140 may be the same or different. The cap layer is preferably a dielectric material (i.e. insulating layer). Typical dielectric materials for the capping layer 140 include any now known or later developed dielectric materials such silicon carbide (SiC), silicon nitride ($Si_3N_4$), silicon dioxide ($SiO_2$), silicon oxynitrides, and nitrogen or hydrogen doped silicon carbide (SiC(N,H)). The capping layer 140 may be a single layer of a material, a series of layers of the same material (by way of example, but not limitation, a series of SiC layers with different C percentage), or a series of layers of different materials.

Any suitable conductive material may be used for the bulk conductor 136 of the first 114, second 124, and fuse 134 conductors. The material used for each of the bulk conductors may be the same or different. Typical bulk conductive materials include materials containing copper (Cu), aluminum (Al), tungsten (W), silver (Ag), gold (Au) and their alloys.

Any suitable liner material may be used for liner 138, and the material used for each of liners of the first 114, second 124 and fuse 134 conductors may be the same or different. Typical liner materials include tantalum (Ta), tantalum nitride (TaN), titanium (Ti), titanium nitride (TiN), tungsten (W), ruthenium (Ru) and ruthenium nitride (RuN). The liner may be a single layer of liner material, or preferably, is a multilayer film of liner material. For example, but not by way of limitation, the liner may be TaN/Ta, Ti/TiN, or W/Ti.

Continuing with FIG. 2, the fuse conductor 134 has a damaged portion 139. The damaged portion 139 can include bulk conductor 136 only, liner 138 only, or as pictured in FIG. 2, the damaged portion 139 includes both conductor 136 and liner 138. The damage, as way of example but not limitation, can take the form of missing material (as shown in FIG. 2), as corroded material, as oxidized material, or a combination of two or more of the previously described damage. "Material" refers to the bulk conductor 136 and/or liner 138 of the fuse conductor 134. The damaged portion 139 depicted in FIG. 2 is at the top corner of the fuse conductor 134. The damaged portion 139 could also be just along the top of the fuse conductor 134 or just along a sidewall 144 of the fuse conductor 134, but in either case, should be proximate to the top corner of the fuse conductor 134. The damaged portion 139 should be damaged to a degree needed to prompt fuse blow at the damage portion and yet still be minimal enough so that the fuse structure operates normally prior to fuse blow. The exact amount of damage (i.e. the amount of material missing, corrosion formed, oxidation occurring) will depend on many factors including, but not limited to, materials used, current load of the fuse structure, and dimensions of the fuse structure.

Still referring to FIG. 2, there is an opening 142 in the cap layer 140 above the fuse level 130. Here, the opening 142 is aligned such that it is over the damaged portion 139 of the fuse conductor 134 and a portion of the fuse insulator 132, thus the opening 142 straddles a sidewall 144 of the fuse conductor 134. In alternative embodiments, the opening 142 can be aligned so as to be completely over the fuse conductor 134 or completely over the fuse insulator 132. But in every case, the opening 142 should be proximate to the sidewall 144 so that the fuse conductor 134 will sustain damage (as explained further in the method section).

At least a portion of the damaged portion 139 of the fuse conductor 134 is below the second insulator 122 (as opposed to being below the second conductor 124 which is shown later in FIG. 3). In the embodiment illustrated in FIG. 2, none of the damaged portion 139 is below the second conductor 124, and there is an optional intervening thin dielectric 146 layer between the damaged portion 139 and the second dielectric 122. The thin dielectric 146 can be made from any of the materials listed for the cap dielectric 140 or insulator layers (112, 122, 132). The thickness of the thin dielectric can be from about 30 A to about 500 A, and ranges therebetween.

Figure 1:
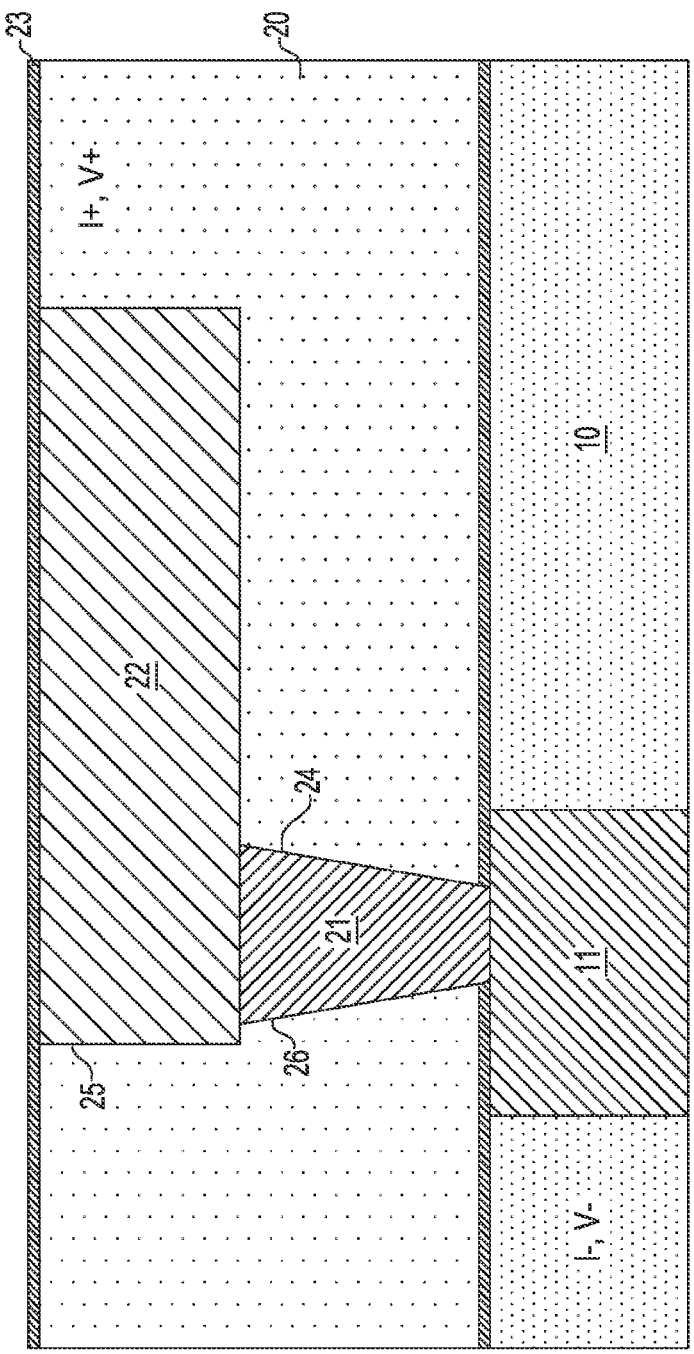
FIG. 1 illustrates a conventional vertical fuse structure.

FIG. 2 generally describes a fuse blow structure in which the first 114 and second 124 conductors can act as first and second connections, respectively, to the fuse structure as indicated by the current (I) and voltage (V) abbreviations. In that case, at least a portion of the fuse conductor 134 is intended to blow during fuse blow. In a specific embodiment, the first and second conductors, 114 and 124, can be line level metallurgy and the fuse conductor 134 is a via connecting the two lines 114 and 124. However, unlike FIG. 1, the second conductor 124 is offset from the via. The offset allows the via (fuse conductor) to be damaged. In a specific embodiment described later in conjunction with FIG. 4, the second conductor, 124, is a via/line structure, preferably, formed by dual damascene.

Figure 3:
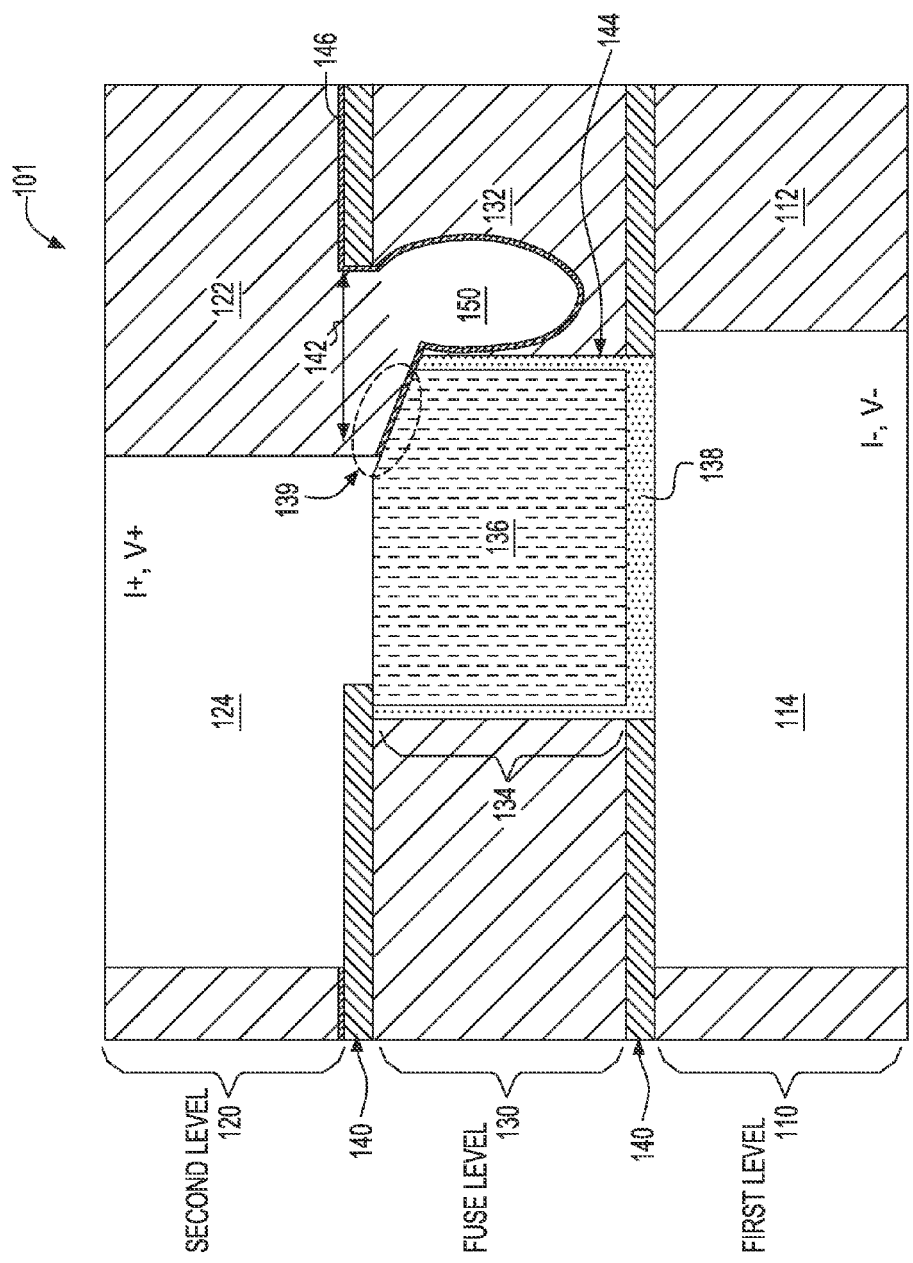
FIG. 3 illustrates a fuse structure prior to fuse blow according to an embodiment of the present invention.

FIG. 3 shows a slightly different embodiment of a fuse structure 101 prior to fuse blow. Here, the same reference numerals as used as in FIG. 2. A first difference is a cavity 150 in the fuse insulator 132. The cavity is proximate to the damaged portion 139 of the fuse conductor 134 and proximate the sidewall 144 of the fuse conductor. The cavity 150 may be open to damaged portion 139 of the fuse conductor 134, or as shown in FIG. 3, second level insulator 122 may partially fill the cavity 150. In an alternate embodiment, second level insulator 122 completely fills the cavity. In FIG. 3, the optional thin dielectric 146 also lines the cavity 150. It should be noted that a cavity 150 can also be used in the embodiment of FIG. 2.

A second difference found in FIG. 3 is the opening 142 in the cap layer. Here, the opening still straddles the sidewall 144 of the fuse conductor 134, but the opening extends all the way to the second conductor 124.

A third difference found in FIG. 3 is that the second conductor 124 is above a portion of the damaged portion 139. Therefore, a portion of the damaged portion 139 is below the second conductor 124 while another portion of the damaged portion 139 is below the second insulator 122. Alternatively, the another portion of the damaged portion is exposed to the cavity 150.

As mentioned earlier, FIG. 2 generally describes a fuse blow structure in which the first 114 and second 124 conductors can act as first and second connections, respectively, to the fuse structure as indicated by the current (I) and voltage (V) abbreviations. In that case, at least a portion of the fuse conductor 134 is intended to blow during fuse blow. In a specific embodiment shown in FIG. 4 the fuse structure is a stacked via fuse structure prior to fuse blow in which the second conductor 124 (acting as the second connection) has a via 126 portion and a line 128 portion. Similarly, the fuse conductor 134 has a via 166 portion and a line portion 168. Please note, the reference numerals and material descriptions used in FIG. 2 also apply to FIG. 4 and will not be repeated, here.

Figure 4:
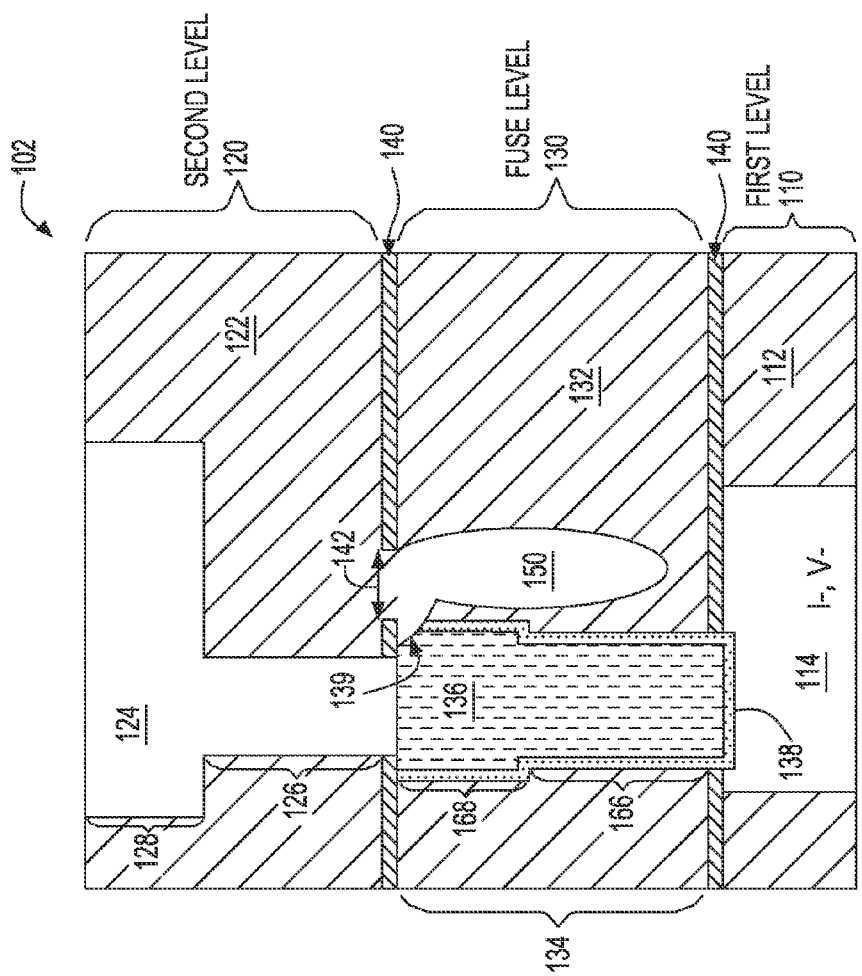
FIG. 4 illustrates a stacked via fuse structure prior to fuse blow according to an embodiment of the present invention.

Referring the stacked via fuse structure 102 of FIG. 4, the structure is called a stacked fuse structure because the fuse via 166 and the second conductor via 126 generally form a stack. Furthermore, the fuse conductor line 168 is preferably minimal dimension; meaning is slightly larger than of the fuse conductor via 166. Thus, in a preferred embodiment, the fuse conductor line 168 minimally, if at all, extends out of the plane of the figure. A further description of stacked via fuse structures can be found in U.S. patent application Ser. No. 13/074407 filed on Mar. 29, 2011 and herein incorporated by reference.

In the stacked via embodiment 102 of FIG. 4, The damaged portion 139 of the fuse conductor 134 is in the line level 168 of the fuse conductor 134; thus the intent is that the fuse will blow at the line level rather than a via level. This intent is the opposite of other fuse blow vertical structures known in the industry which intend to blow the fuse in a via.

Still referring to FIG. 4, the cavity 150 description of FIG. 3 also applies to FIG. 4. The cavity as shown in FIG. 4 extends nearly the full height of the fuse insulator 132. In an alternate embodiment, the cavity 150 could be shorter; for example, and not by limitation, the cavity 150 may only extend to a location even with the fuse line 168 and fuse via 166 intersection. Alternatively, the cavity 150 may also extend all the way to the cap layer 140 located on top of first level 110.

A fuse structure having a cavity 150 can easily be incorporated into a device which has an air gap process. In an air gap process, cavities 150 (i.e. air gaps, also known as voids) are formed in the insulator level in order to reduce the resistance capacitance delay (RC delay) of the interconnect levels. FIG. 5 shows a cross section of an integrated circuit having a stacked via fuse bank on the left and a non-fuse bank area on the right. The non-fuse bank area practices an air gap process. In the fuse bank area the opening 142 in the cap layer 140 is aligned so as to be proximate to the fuse conductor 134. In the non-fuse bank area, the openings 142 in the cap layer 140 are aligned so as to be roughly equidistant from consecutive conductors 170. FIG. 6 is a top down view of the fuse level 130 of FIG. 5. Here, the ovals represent the opening 142 in the cap layer and the dotted rectangles represent the fuse conductors 134 and non-fuse bank conductors 170 below the cap layer 140. Thus, the air gap process of a non-fuse bank area and a damaged fuse (with or without a cavity) of a fuse bank area can be easily integrated by using a single mask to form openings in the cap layer 140.

Returning to FIG. 5, a cavity 150 in the fuse bank area can be referred to as a first cavity. The first cavity, as explained above is aligned to be proximate to the fuse conductor 134, and in particular, proximate to a damaged portion 139 of the fuse conductor 124. A cavity 150 in the non-fuse bank area can be referred to as a second cavity. The second cavity is more or less centered in the insulator 132 between consecutive interconnects 170 of the non-fuse bank area. In FIG. 5, the second cavity runs the height of the fuse level 130, but in alternative embodiments, the second cavity may only extend down to be even with the line (top, wider portion) of the interconnect 170.

Figure 7:
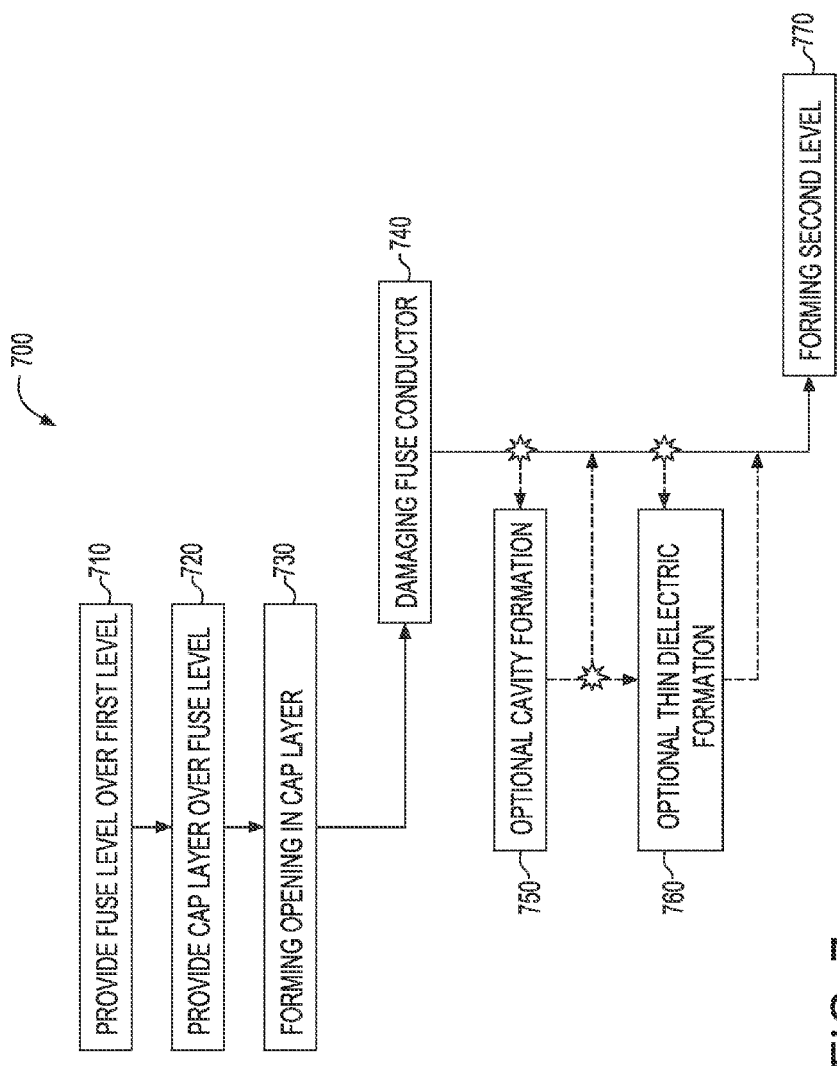
FIG. 7 illustrates a flow chart for making a fuse structure having a damaged portion according to an embodiment of the present invention.

FIG. 7 is a flow chart 700 for making a fuse structure having a damaged portion. Initially, in step 710 a fuse level 130 is provided over a first level 110. In step 720 a cap layer 140 is provided over the fuse level 130. In step 730 an opening is made in the cap level. In step 740 a portion of fuse conductor 134 is damaged. In step 770 a second level 120 is formed. Opening the cap layer 730 may occur as a separate process step or in conjunction with step 740, damaging the fuse conductor.

Flow chart 700 also contains optional steps denoted by dotted arrows. One optional step is forming a cavity 750 in a fuse insulator adjacent the damaged portion of fuse conductor. Cavity formation 750 may occur as a separate process step or in conjunction with step 740, damaging the fuse conductor. Likewise, step 730 (opening the cap layer 140), step 740 (damaging the fuse conductor) and 750 (forming cavity 150) may be three separate process steps, two separate process steps or one process step.

Another optional step is forming a thin dielectric layer 760. Both optional steps (750 and 760) may be performed, one of the optional steps may be performed (750 or 760), or no optional steps may be performed. In a preferred embodiment, both optional steps (750 and 760) are performed.

FIGS. 8a-f illustrate of a method of making fuse structures (100, 101, 102) having a damaged portion 139 according to an embodiment of the present invention. For ease of viewing, the figures do not show the first level 110, but it is understood that the fuse level 130 is above a first level 110. In addition, the reference numerals used in FIGS. 8a-f are the same as those used in FIGS. 2-6. Accordingly, the earlier descriptions used with respect to the reference numerals also apply to FIGS. 8a-f.

Referring to FIG. 8a, a fuse level 130 has a fuse insulator 132 and a fuse conductor 134. The fuse conductor 134 can include a bulk conductor 136 and a liner 144. A cap layer 140 is above the fuse level 130. The cap layer has an opening 142 which, in this embodiment, straddles a sidewall 144 of the fuse conductor 134. The cap layer 142 is opened using a etch process, preferably a reactive ion etch (herein "RIE"). The cross section in FIG. 8a illustrates a fuse structure being built after step 730 of FIG. 7 (forming an opening in a cap layer) has been completed.

In FIG. 8b, the fuse level 130 material exposed by the cap opening 142 is etched. The etch damages a portion 139 of the fuse conductor 134. In the embodiment shown, the damaged portion includes both the bulk conductor 136 and liner 138. In addition, some of the fuse level insulator 132 is removed. The cross section in FIG. 8b illustrates a fuse structure being built after step 740 (damaging fuse conductor) has been completed.

At this point, an etching process can continue such that step 750, forming a cavity 150, is preformed, or alternatively, the etching process can be stopped and the process move to the step in FIG. 8d or 8e. If the etching process is stopped, then the final fuse structure will not have a cavity (for example, see a fuse structure embodiment shown in FIG. 2).

FIG. 8c illustrates the embodiment in which the optional cavity (150) formation step 750, is performed.

As explained earlier steps 730 (cap open), 740 (damage) and 750 (cavity formation) can use the same or different processes. A standard RIE process that can be used in any of the steps, can be a halogen containing precursors along with oxygen containing precursors. In a preferred embodiment, the RIE process for at least the cavity formation step 750 includes an oxygen flow 5-10 sccm greater than the standard known in the art. Or, in an alternative embodiment, instead of increasing oxygen flow, the flow of polymerizing gases (fluorocarbons) can be reduced. Reducing fluorocarbons enhances lateral etching leading to sidewall 144 etching of the fuse conductor 134.

In FIG. 8d an optional thin dielectric 146 is deposited. In a preferred embodiment the thin dielectric covers the surface of the structure, including the damaged portion 139, cavity 150 and cap layer 140. Thus, the intent is for the thin dielectric to line the entire surface of the air gap region, though depending on the geometry of the cavity 150 and its relation to the cap layer 140, there may be some discontinuities in the thin dielectric 146. The thin dielectric 146 can be deposited by a variety of techniques including, but not limited to, Chemical Vapor Deposition (CVD), Low Pressure CVD (LPCVD), Plasma Enhanced CVD (PECVD), and Atomic Layer Deposition (ALD). The cross section in FIG. 8d illustrates a fuse structure being built after optional step 760 (forming thin dielectric) has been completed in an embodiment in which optional step 750 (forming cavity) was also completed.

In FIG. 8e, a second level insulator 122 is deposited as previously described in conjunction with FIG. 2. The insulator can be deposited by any of the following methods, or in the case of a multilayer insulator film a combination of the following methods: CVD, LPCVD, PECVD, ALD, and spin on.

In FIG. 8f, the second level conductor 124 is deposited in a hole (not shown) etched into the second level insulator 122. The second level conductor 124 can act as a second connection. It, combined with the damaged 139 fuse conductor 134 and first level 110 conductor (not shown) acting as a first connector form a fuse structure (100, 101 or 102) having a damaged portion 139. The cross section in FIG. 8f illustrates a fuse structure after step 770 (forming second level) has been completed.

The fuse structures of the present invention have the advantage of fuse blow in a consistent, known location. The fuse structure of the present invention uses intentionally created pre-existing damage to aid fuse blow. Some embodiments of the fuse structure of the present invention are designed so that fuse blow takes place at the line level rather than the via level. Some embodiments of the present invention provide a cavity in the insulator proximate to the damaged portion. The cavity provides a place for blown fuse material to go without damaging the structure. The cavity embodiment is also easily integrated (meaning no extra steps or masks are needed) in air gap back end of line interconnect structures.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadcast interpretation so as to encompass all such modifications and equivalent structures and functions.

What is claimed is:

1. The method of forming a fuse structure comprising:
   providing a substrate having a first level comprising a first conductor and a first insulator;
   providing a fuse level above the first level, wherein the fuse level has a fuse insulator, a fuse conductor, and a cap layer above the fuse insulator and the fuse conductor;
   forming an opening in the cap layer;
   damaging a portion of the fuse conductor thereby forming a damaged portion of the fuse conductor; and
   forming a second level comprising a second conductor and a second insulator wherein the second insulator is above at least a portion of the damaged portion of the fuse conductor.

2. The method of claim 1 wherein the opening is proximate to the fuse conductor.

3. The method 1, wherein the opening is above at least a portion of the fuse conductor.

4. The method of claim 1, wherein,
   the damaged portion of the fuse conductor is proximate a top corner of the fuse conductor.

5. The method of claim 1, wherein,
   the damaged portion of the fuse conductor is proximate a sidewall of the conductor.

6. The method of claim 1, wherein,
   the damaged portion is a line level of the fuse conductor.

7. The method of claim 1, wherein,
   damaging the damaged portion of the fuse conductor includes reactive ion etching, wet etching or a combination of both.

8. The method of claim 1, further comprising:
   forming a thin dielectric over the damaged portion of the fuse conductor.

9. The method of claim 1, further comprises:
   forming a cavity in the fuse insulator wherein the cavity is proximate to the fuse conductor.

* * * * *